United States Patent

Bumb, Jr. et al.

[11] Patent Number: 5,926,027
[45] Date of Patent: Jul. 20, 1999

[54] APPARATUS AND METHOD FOR TESTING A DEVICE

[76] Inventors: Frank E. Bumb, Jr., 1631 W. Flower Cir. South; Geoffrey W. Gates, 1836 E. Turquoise Ave., both of Phoenix, Ariz. 85020; David C. Good, 2709 E. Sunnyside Dr., Phoenix, Ariz. 85028

[21] Appl. No.: 08/995,734

[22] Filed: Dec. 22, 1997

Related U.S. Application Data

[63] Continuation-in-part of application No. 08/535,488, Sep. 28, 1995., abandoned

[51] Int. Cl.$^6$ .................................................. G01R 31/26
[52] U.S. Cl. ............................................ 324/755; 324/765
[58] Field of Search .................................. 324/754, 755, 324/757, 765

[56] References Cited

U.S. PATENT DOCUMENTS

4,560,216  12/1985  Egawa ................................. 324/755 X
5,410,258   4/1995  Bowers et al. ......................... 324/755
5,808,474   9/1998  Hively et al. ........................... 324/755

*Primary Examiner*—Glenn W. Brown
*Attorney, Agent, or Firm*—Parsons & Goltry; Michael W. Goltry; Robert A. Parsons

[57] ABSTRACT

An apparatus for testing a device including a plurality of elements each having contact surface and a non-contact surface, the apparatus comprising a base for holding the device, the base having a contact surface engageable with the contact surface of each element, an actuator, a plurality of compliant members carried by the actuator to engage the non-contact surface of each element, each compliant member further including an aspect ratio of at least 1:1, and means for exerting a force against the actuator, the aspect ratio for allowing the compliant members to compensate for physical variations of the elements, provide compliance between the apparatus and the elements and substantial coplanarity between the contact surface of each element and the contact surface of the base while allowing a sufficient focusing of force by the compliant members against the non-contact surface of each element to provide contact between the contact surface of each element and the contact surface of the base without damaging the elements.

20 Claims, 5 Drawing Sheets

APPARATUS AND METHOD FOR TESTING A DEVICE

The instant application is a continuation-in-part of applicant's application, Ser. No. 08/535,488, entitled Apparatus and Method For Testing a Device, filed Sep. 28, 1995, now abandoned.

BACKGROUND OF THE INVENTION

1. Field of the Invention

This invention relates to an apparatus for testing devices.

More particularly, this invention relates to an apparatus for testing semiconductor devices.

In a further and more specific aspect, the present invention relates to an apparatus and method for testing semiconductor devices.

2. Prior Art

Integrated circuit devices, tiny electronic circuits used to perform a specific electronic function, are normally combined with other components to form a more complex system. Typical integrated circuits (IC's) are formed as a single unit by diffusing impurities into single-crystal silicone, which then serves as a semiconductor material, or by etching the silicone by means of electron beams. Several hundred identical integrated circuits are made at a time on a thin wafer several centimeters in diameter, and the wafer is subsequently sliced into individual ICs called chips. Chips are assembled into packages containing external electrical leads to facilitate insertion into printed circuit boards for interconnection with other circuits or components.

Integrated circuits have produced revolutionary changes in electronic equipment. Computer technology has benefited greatly. The logic and arithmetic functions of a small computer can now be performed on a single VLSI chip called a microprocessor, and the complete logic, arithmetic, and memory functions of a small computer can be packaged on a single printed circuit board, or even on a single chip.

In consumer electronics, IC's have made possible the development of many new products, including personal calculators and computers, digital watches, and video games. They have also been used to improve or lower the cost of many existing products, such as appliances, televisions, radios, and high-fidelity equipment. They have been applied in the automotive field for diagnostics and pollution control, and they are used extensively in industry, medicine, traffic control (both air and ground), environmental monitoring, and communications.

Due to the important role IC's play in industry, they need to be tested at various steps in the manufacturing or production process in order to evaluate their operation and quality. Many tests are carried out by passing voltage through the IC and checking to ensure set inputs yield desired outputs. Normally, IC devices are provided with external leads having various shape configurations such as gull-winged leads. Thus, a common method of testing an IC device is actuating the IC by engaging the external leads with a contact portion of a test socket. The contact portion of the test socket electronically communicates with a testing device facilitating the measuring of electrical outputs based on set electrical inputs. Typically, when the contact portion becomes engaged with the external leads to provide the metal to metal contact necessary for a proper electrical connection, it is referred to as an "insertion," "actuation," or "hit."

Test sockets are ideally suited for production test and device characterization. In production test, the extended life of the socket is important because it allows the cost of the socket to be amortized over the production of a large number of parts, and it reduces down time required to maintain or replace the sockets. Sockets used for production test are also called contactors to denote the extended life. For instance, the term "socket" is often used to describe devices which will handle anywhere from one to perhaps fifty insertions, actuations, or hits. A contactor or test socket, normally accommodates from 1,000 to 1,000,000 insertions.

In device characterization, superior electrical quality is important for determining how well an IC functions. Ideally, device characterization measurements reflect the part performance and need not be colored by the test environment, particularly the socket. Device characterization is typically performed using a "hand socket" having a lid mechanism attached to a socket housing.

Characteristics of sockets which determine their applicability to given test situations include reliable contact, electrical performance and mechanical performance. The two main factors which impact the ability of the socket to establish reliable contact are penetrating contaminants on the device leads and accommodating lack of lead coplanarity. During the manufacturing process, various contaminating elements build up on the lead of the IC, not the least of which is natural oxidation of the lead materials. When testing the parts, the contacting mechanism must break through these contaminants. The typical method of doing this is with a "wiping" connection in which the lead to be contacted slides past, and is gently abraded or cut into by the socket contact.

The second factor is lack of coplanarity. Ideally, all leads on a multi-lead part contact a flat surface. e.g., the contacts on a socket, at the same time. Typically, the three lowest leads define the plane of contact and all other leads will miss the surface. There are several root causes, namely, the differing thickness of the leads, differing alignments of the leads due to mishandling, presentation of the device to the socket at an angle, differing height or thickness of the socket contacts, and probably many others. The solution is for there to be compliance or flexibility somewhere in the system so that the device leads and the socket contacts can adjust themselves to mate properly.

Electrical performance, as mentioned above, is measured in terms of various parameters including, but not limited to, inductance and capacitance. The design elements in a socket which influence these parameters include lead length and lead form.

The mechanical performance of a test socket possesses an array of concerns or factors including the number of insertions, proper alignment of the device to be tested, lack of damage to the device, susceptibility of the socket to damage, and temperature ranges, etc. One component which influences many of these factors is the pitch or lead spacing of the devices being tested. As semiconductors have become more complex and powerful, the number of inputs and outputs to a single device has increased. Where twenty years ago a single chip would have perhaps 28 inputs/outputs maximum on 0.1" centers with substantial leads, today devices will have 400 or more and new package types are being designed with up to 1000. As a result, there are more leads which are finer and closer together. Today, parts with leads 0.007" wide with 0.008" space between them are being used. The impact of these scales on test sockets is twofold: there is very little tolerance for misaligning the part with the socket, and the leads are easily damaged.

The prior art has provided an array of apparatus for testing IC's or packaged semiconductors, and having impressive electrical and mechanical characteristics. In particular, existent in the prior art is a semiconductor chip test jig for testing primarily chips having "gull-wing" shaped leads. Provided is a body incorporating a cover having a pressure body that is hinged or gimbaled therewith, allowing limited horizontal mobility of the pressure body. Depending from the pressure body exist a set of "knife-edge" lead supports. When the cover is engaged with the body of the jig, bottom edges of the lead supports, which match the trim of the semiconductor chip leads, press against the leads of the semiconductor chip, which bring the leads into engagement with spring-loaded pins. Since the bottom edges of the lead supports match the trim of the semiconductor chip leads, the pressure body will not occasion deformation of the lead when pressure is applied thereto. Also, because the spring-loaded pins contact the leads at points directly opposite where they are supported by the pressure body, the pins will also not cause deformation of the leads. This apparatus is notable for testing devices having "gull-wing" shaped leads, and it seems to address the notions of coplanarity and compliance for achieving acceptable mechanical and electrical contact.

Also known in the prior art is a compliant pad apparatus including substrate suitably constructed of silicone or ceramic material. An interconnect layer is provided on the upper surface of the substrate, with a metal pad positioned intermediate the surface of the interconnect layer and a pad constructed of an electrically conductive, compliant material. At the upper surface of the electrically conductive compliant pad is a contact layer comprising a thin layer of conductive metal, against which the lead from the integrated circuit is received. Like the aforementioned apparatus, this apparatus introduces compliance or flexibility from the bottom of the lead, and seems to address the notion of coplanarity for achieving acceptable mechanical and electrical contact.

However, the inherent shortcoming of the above mentioned prior art devices, is that the compliance is provided from the contact surface of the test apparatus. Thus, the contact surface is provided as being inherently compliant or flexible. Also, as the leads of the device to be tested get smaller, flat rigid contact surfaces become necessary for achieving the desired mechanical and electrical connection. Additionally, since device leads are inherently non-coplanar due to mechanical variations resulting from manufacturing and mishandling, it is desirable to provide a device that functions as if the leads were coplanar. That is, it is desirable to have flat and rigid lead to contact engagement, otherwise known as coplanarity, in addition to compliance for absorbing the mechanical imperfections existent in the leads and the contact surface of the test apparatus.

In a more specific aspect, apparatus that introduce compliance from the contact surface, or bottom, of the leads of the device to be tested are inherently complicated mechanical devices which become increasingly more difficult to manufacture when the leads become increasingly small. Also, the mechanical mechanism required to introduce compliance from beneath the leads compromises the electrical connection of the test apparatus. Therefore, it seems desirable to provide an apparatus which can be used with devices having an array of lead sizes from the very small to the more larger, is inexpensive to manufacture, and that provides compliance with the use of flat rigid contact surfaces. Yet, it is imperative to have a non-compliant contact surface for achieving superior contacting between the leads of the device to be tested, and the contact surface.

Another pertinent apparatus includes a resilient probe device for use in electrically testing printed circuit boards, and used in place of conventional metal test pins. Specifically provided is an elongate strip of non-conductive elastomeric material retained within a vertical slot formed in a rigid, non-conductive, preferably tapered holder, the elastomeric strip preferably extending therefrom. Imbedded within the interior of the elastomeric strip exist a series of vertically extending electrically conductive strip members projecting slightly beyond the elastomeric strip. The upper end of the holder is coupled to the under side of a topology circuit board. The elastomeric strip is compressed between the topology circuit board and a printed circuit board to establish electrical contact between test contact points via the imbedded conductor members. Like the above mentioned prior art devices, this apparatus introduces compliance or flexibility from the bottom of the lead, and seems to address the notion of coplanarity for achieving acceptable mechanical and electrical contact. However, as has herein been discussed, the non-compliant nature of the contact surface of this device is inherently impractical when the leads of the device to be tested become very small.

Other notable apparatus incorporate a lead backer which introduces force on the top of the leads for exerting the leads against a contact mechanism. However, these lead-backer systems are inherently non-compliant and do not yield satisfactory test results with non-compliant contacts.

Accordingly, the notable deficiencies inherent in the prior art rest upon the failure to provide a test socket that is mechanically efficient, and that occasions superior electrical contact with rigid contacts. In other words, the prior art has failed to provide a system that is both compliant for absorbing the mechanical variations inherent in the leads and the contact surface, and able to achieve substantial coplanarity between the leads and the contact surface for facilitating a superior electrical connection. Additionally, the above mentioned prior art devices each do not have appreciable extended life due to damaged occasioned to the contacts over a relatively small amount of actuations, and damage to the leads as a result of the failure to provide sufficient compliance.

It would be highly advantageous, therefore, to remedy the foregoing and other deficiencies inherent in the prior art.

Accordingly, it is an object of the present invention to provide a new and useful apparatus for testing semiconductor devices.

Another object of the present invention is to provide a new and useful apparatus that is easy and inexpensive to manufacture.

And another object of the present invention is to provide an apparatus that may be used without modification to existing technology.

Still another object of the present invention is to provide an apparatus having reliable and exemplary contact performance.

Yet another object of the instant invention is to provide an apparatus having superior electrical and mechanical performance.

Yet still another object of the instant invention is to provide an apparatus that may be used without causing damage to the device being tested.

And a further object of the invention is to provide an apparatus having an improved extended life.

Still a further object of the immediate invention is to provide an apparatus for introducing compliance in a systems having non-compliant contacts.

Yet a further object of the invention is to provide an apparatus able to attain substantial coplanarity between leads and a contact surface without causing damage to either the leads or the contact surface.

And still a further object of the invention is to provide an apparatus able to accommodate a wide range of mechanical variances inherent in leads of packaged semiconductor devices and in contact surfaces.

Another object of the instant invention is to provide an apparatus that improves the utility of the Particle Interconnect® contact substrate in test applications.

And another object of the instant invention is to provide an apparatus which is easy to use.

And yet another object of the instant invention is to provide an apparatus that may be used not only in hand held test applications, but also with automated testing apparatus.

And yet still another object of the instant invention is to provide a new and useful method for testing a device.

SUMMARY OF THE INVENTION

Briefly, to achieve the desired objects of the instant invention in accordance with a preferred embodiment thereof, provided is an apparatus for testing a device including a plurality of elements each having contact surface and a non-contact surface. In a preferred embodiment, the apparatus is generally comprised of a base for holding the device, the base having a contact surface engageable with the contact surface of each element, and an actuator including a body having a plurality of compliant members carried by and extending outwardly therefrom, each compliant member terminating with a free end to engage the non-contact surface of each element, each compliant member further including an aspect ratio of at least 1:1. Further included is a means for exerting a force against the body of the actuator, the aspect ratio for allowing the compliant members to compensate for physical variations of the elements, provide compliance between the apparatus and the elements and substantial coplanarity between the contact surface of each element and the contact surface of the base while allowing a sufficient focusing of force by the compliant members against the non-contact surface of each element to provide contact between the contact surface of each element and the contact surface of the base without damaging the elements.

The present invention also proposes an associated method of testing a device.

BRIEF DESCRIPTION OF THE DRAWINGS

The foregoing and further and more specific objects and advantages of the instant invention will become readily apparent to those skilled in the art from the following detailed description of preferred embodiments thereof taken in conjunction with the drawings in which.

DETAILED DESCRIPTION OF THE PREFERRED EMBODIMENT

Figures 1, 2:
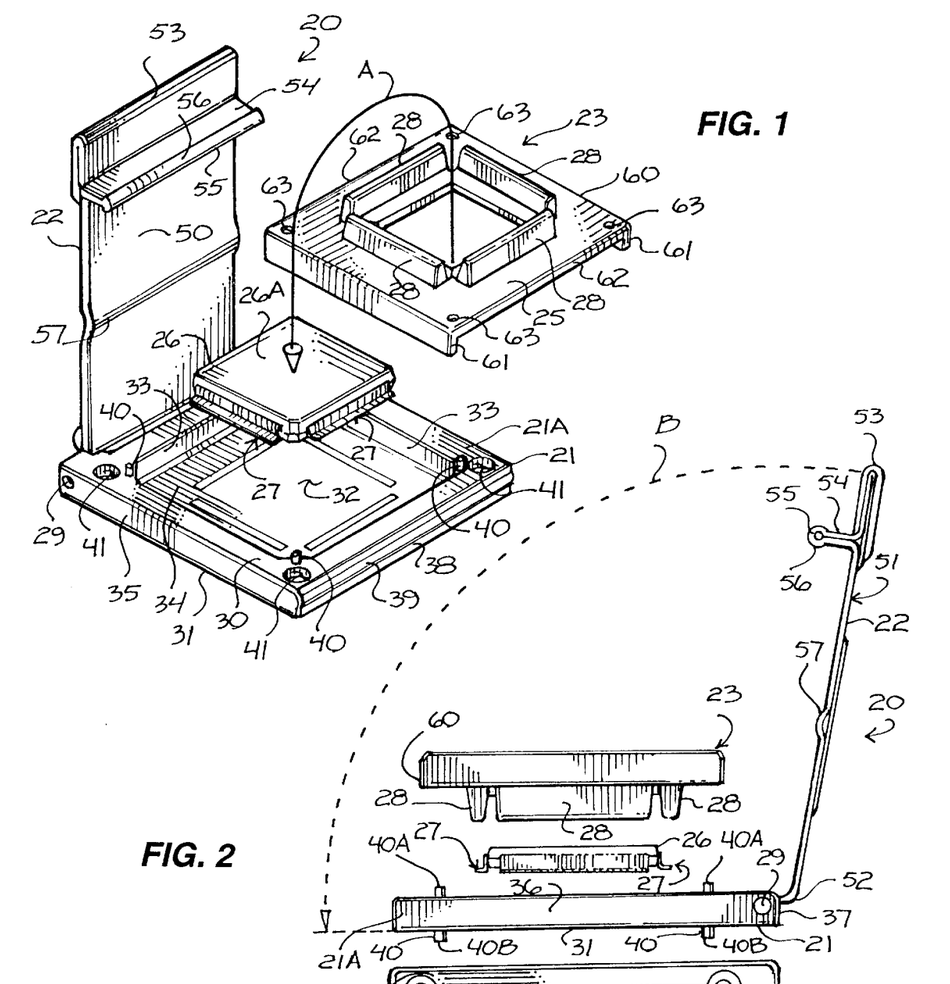
FIG. 1 illustrates an apparatus for testing a device, in accordance with a preferred embodiment of the present invention.
FIG. 2 illustrates a side elevational view of the apparatus of FIG. 1, the apparatus having a lid shown as it would appear in a first position.

Turning now to the drawings, in which like reference characters indicate corresponding elements throughout the several views, attention is first directed to FIG. 1 illustrating an apparatus for testing a device 26 such as a packaged semiconductor as shown or an integrated circuit (IC), the apparatus being generally designated by the reference character 20. Apparatus 20 operates as a test socket and is generally comprised of a base 21 for holding device 26 and an actuator 23. Base 21 includes a support member 21A and a lid 22 mounted for movement with support member 21A, such as by a hinge 29. Actuator 23 is comprised of a body 60 having a plurality of compliant members 28 mounted thereto and extending outwardly from a lower surface 25 thereof, compliant members 28 each terminating with a free end 67 engagable with device 26 in a manner to be described presently. Device 26 shown is a typical packaged semiconductor having an upper surface 26A and a plurality of lead portions 27 extending outwardly therefrom.

Figure 3:
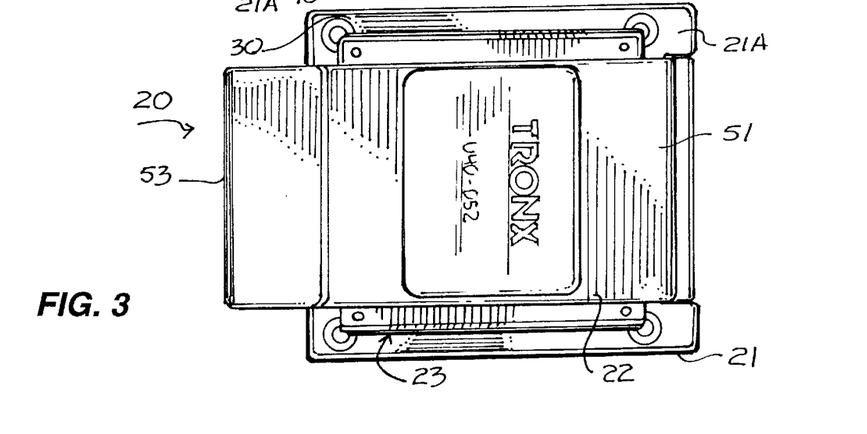
FIG. 3 illustrates top plan view of the apparatus of FIG. 2, the lid shown as it would appear in a second position.
Figure 4:
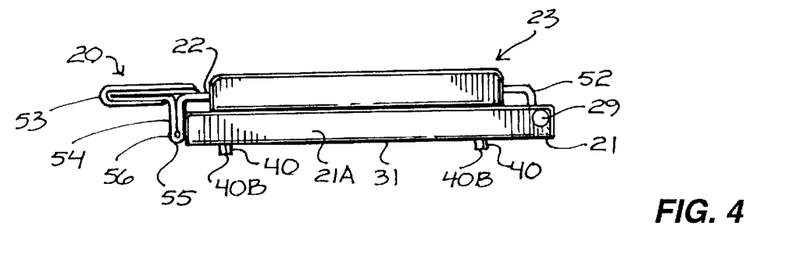
FIG. 4 illustrates a side elevational view of the apparatus set forth in FIG. 3.

With additional reference to FIG. 2, FIG. 3, and FIG. 4, support member 21A includes an upper or top surface 30, a lower or bottom surface 31, and a chamber 32 defined by continuous inner side wall 33 and upper surface 34. Support member 21A further includes side surfaces 35 and 36, rear end surface 37 and front end surface 38. Carried by front end surface 38 is an elongate generally horizontal protruding member 39. Support member 21A also includes a plurality of guide pins 40, each having an upper end 40A and a lower end 40B, extending through support member 21A, and a plurality of apertures 41 for receiving screws or other suitable engagement mechanism operative for engaging apparatus 20 to a desired surface.

Lid 22 includes an inner surface 50, an outer surface 51, an end 52 mounted for movement with support member 21A and a free end 53 defining a handle. Lid 22 further includes an element of an engagement pair comprising a laterally extending member 54 extending outwardly from inner surface 50 and terminating with a free end 55 defined by enlargement 56. Lid 22 still further includes an elongate generally transverse protuberance 57 integrally formed therewith and at an intermediate position thereof. Although protuberance 57 is shown as being integrally formed with lid 22, it may be provided as a separate attachment if so desired.

Regarding FIG. 1, device 26 is shown substantially as it would appear for placement within chamber 32. Actuator 23 may then be placed over device 26 in the direction indicated by the arrowed line A with lower surface 25 of body 60 being adjacent to device 26. Lid 22 may then be moved along pivotal traverse in the direction indicated by the dotted arrowed line B in FIG. 2 from the position to the closed position and enlargement 56 snappingly and detachably engaged with protruding member 39 to engage lid 22 with front end surface 38 of base 21 in the closed position of lid 22 as shown in FIGS. 3 and 4 thus capturing actuator 23 and device 26 in chamber 32. In the closed position of lid 22, protuberance 57 engages upper surface 24 of actuator 23 at a substantially central or intermediate position thereof exerting axial force against actuator 23 pressing compliant members 26 against lead portions 27 to facilitate contact between lead portions 27 and apparatus 20, the axial force being evenly applied across actuator 23 at the substantially central location of upper surface 24 of actuator 23.

Member 54 and protruding member 39 function as an engagement assembly for engaging lid 22 to base 21 in the closed position of lid 22. Additionally, lid 22 allows a user to exert desired force upon actuator 23 to bear compliant members 28 against lead portions 27 of device 26. Furthermore, protuberance 57 functions as a presentation element engageable with the upper surface 24 of the actuator 23 for evenly presenting the compliant members 28 against the device 26.

When testing packaged semiconductors or integrated circuits with apparatus 20, apparatus 20 functions as a plug to interconnect the device to be tested with an external component such as a load board. As such, apparatus 20 desirably operates to provide mechanical and electrical contact between the device to be tested and other components.

Figure 5:
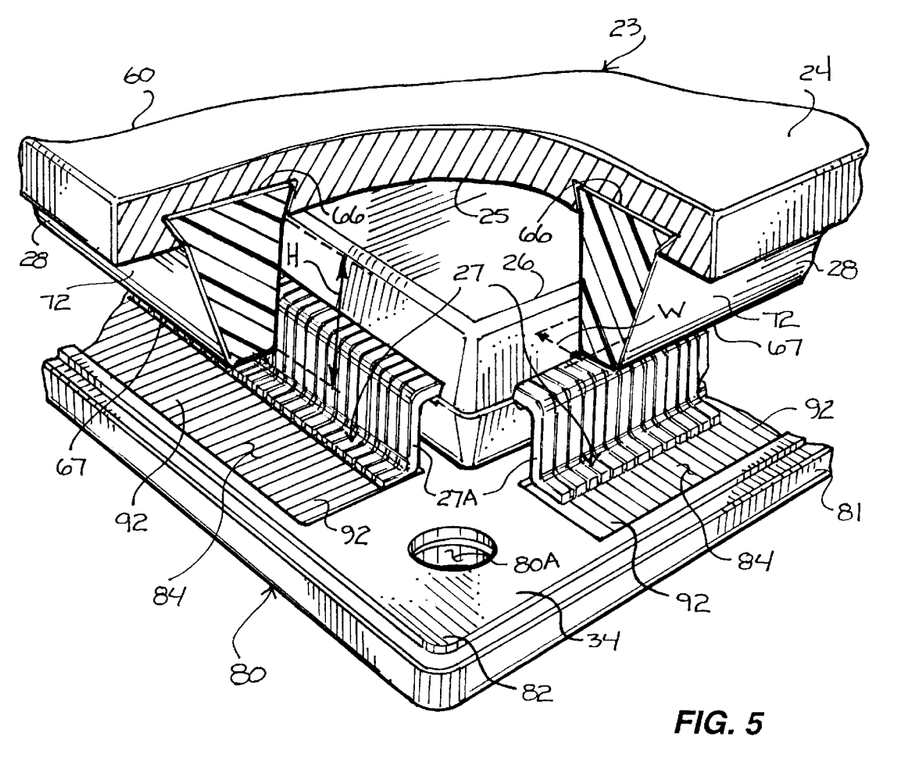
FIG. 5 illustrates an enlarged fragmented perspective view of a device sandwiched between an actuator and a contact assembly of the present invention, portions of the actuator being broken away for purposes of illustration.

With attention directed to FIG. 5, illustrated is an enlarged fragmented perspective view of device 26 sandwiched between actuator 23 and a contact assembly of the present invention, portions of actuator 23 being broken away for purposes of illustration. As can be seen with additional reference to the environment depicted in FIG. 1, actuator 23 includes a body 60 having upper surface 24, lower surface 25, end members 61, and ends 62. Body 60 is also shown as having apertures 63 sized to receive guide pins 40 carried by support member 21A for retaining body 60 in an operative orientation when apparatus 20 is in the closed position and for aligning the actuator 23 and the device 26 to be tested.

Figure 6:
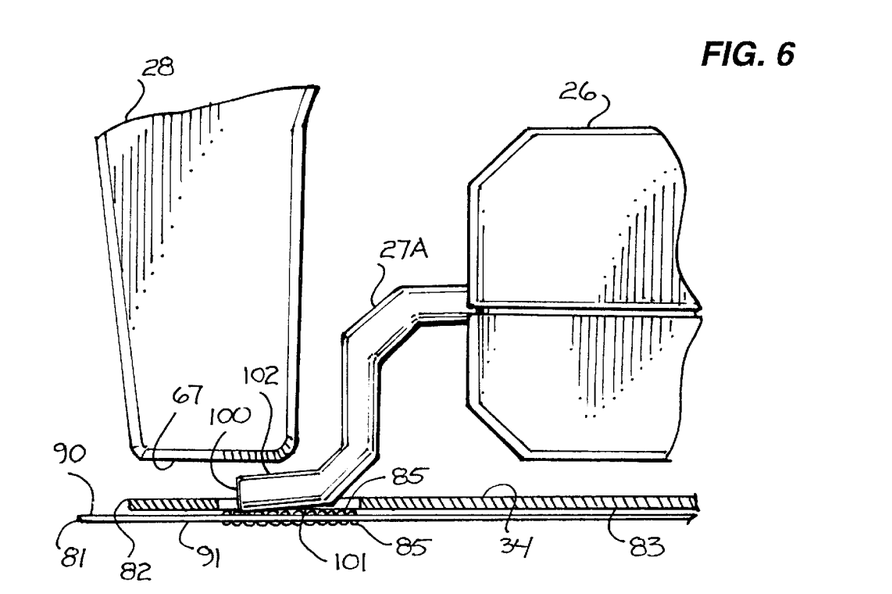
FIG. 6 illustrates an enlarged side view of a portion of the actuator set forth in FIG. 5, the actuator having a compliant member to engage an element of a device with a contact surface of the contact assembly first set forth in FIG. 5.
Figure 7:
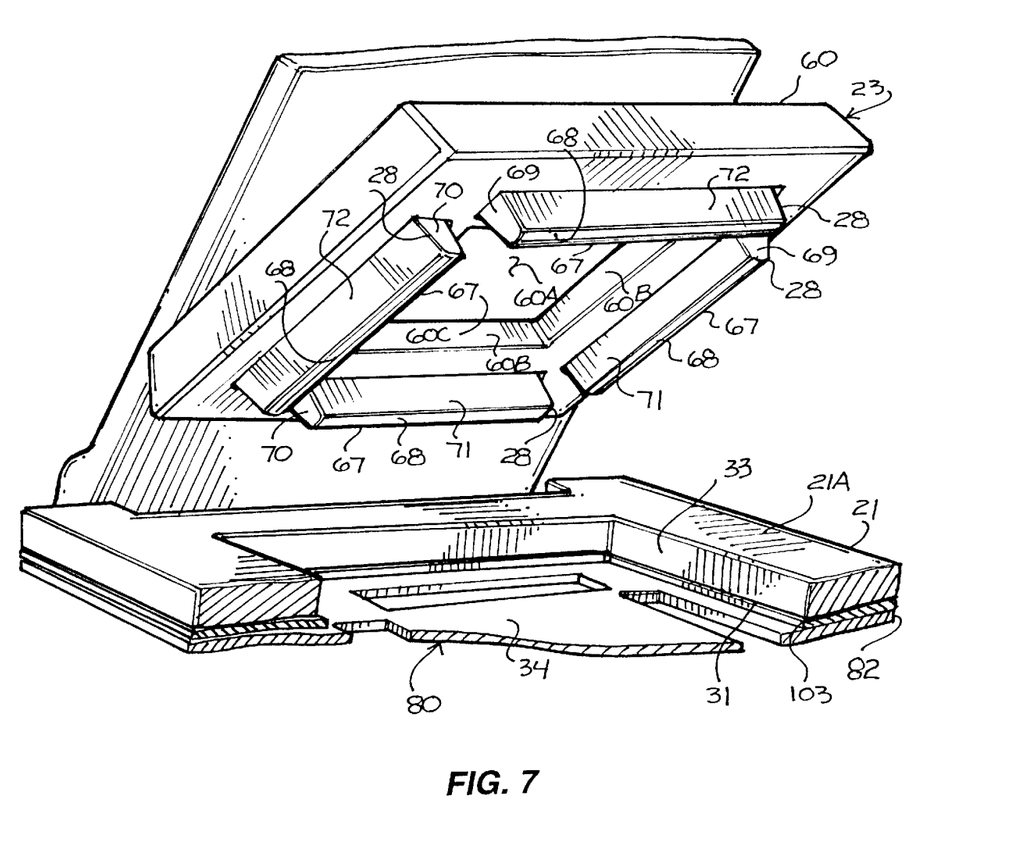
FIG. 7 illustrates a perspective view of the actuator of FIG. 5 having a plurality of compliant members, in addition to a fragmented view of the contact assembly of FIG. 5 as it would appear mounted with a support member of the present invention.
Figure 8:
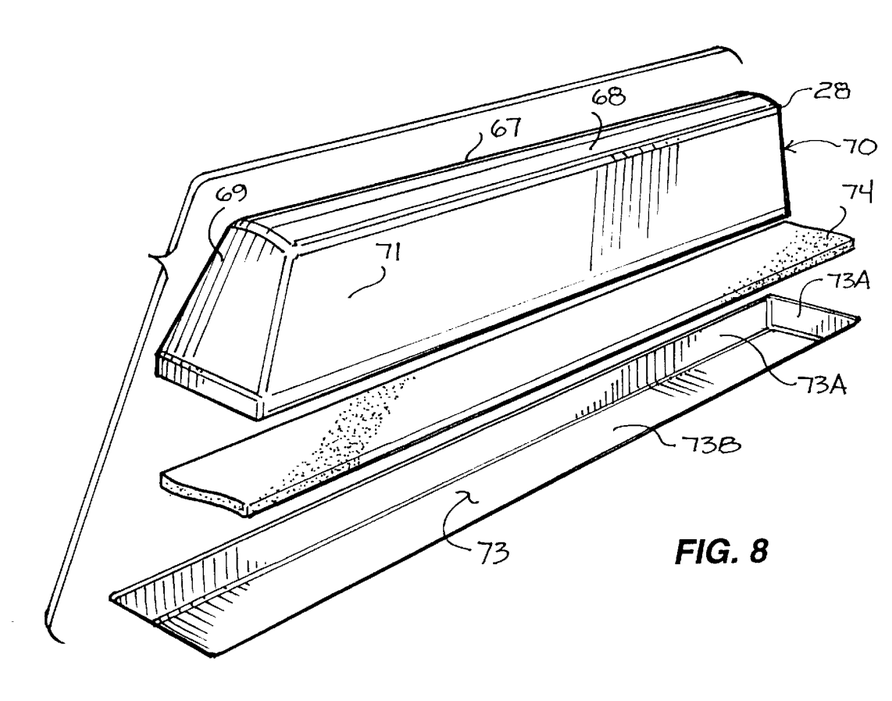
FIG. 8 illustrates an enlarged exploded perspective view of one of the compliant members of FIG. 7 in addition to a recess formed in the actuator for receiving the compliant member and a strip of adhesive material positioned therebetween.

With continuing reference to FIG. 5 and additional reference to FIG. 6, FIG. 7, and FIG. 8, mounted with and depending from the lower surface 25 of the actuator 23 are compliant members 28. Each compliant member 28 includes an inner end 66 mounted with lower surface 25 and extends outwardly therefrom terminating with free end 67. Each compliant member 28 further includes opposing ends 69 and 70, an inner side surface 71 and an outer side surface 72. Each compliant member 28 may be constructed of a deformable or otherwise resilient elastomeric material such as silicone rubber, or other like material. FIG. 5 and FIG. 6 illustrate inner end 66 of each compliant member 28 as retained or affixed to a recess or channel 73 formed in lower surface 25 of body 60 by virtue of an adhesive substance 74 provided therebetween, channel 73 being defined by a continuous sidewall 73A and a lower surface 73B. Adhesive substance 74 may be of any preferred or suitable material such as a silicone based adhesive, or other suitable material that may withstand extreme temperature ranges. Furthermore, compliant members may readily be affixed to body 60 of the actuator 23 by any suitable means.

As shown in FIG. 7, body 60 of actuator 23 includes a recessed portion 60A defined by continuous inner sidewall 60B and inner surface 60C, recessed portion 60A being formed with lower surface 25. Recessed portion 60A receives portions of device 26 when actuator 23 is positioned upon device 26. As a result of such a configuration, the height of the compliant members 28 may be varied and controlled to provide a desired and selected degree of force across the lead portions 27.

With continuing reference specifically to FIG. 5 and FIG. 6, base 21 further includes a contact assembly mounted with support member 21A at bottom surface 31, contact assembly being generally designated by the reference character 80. Regarding a preferred embodiment, contact assembly 80 includes a contact set substrate 81 and an alignment grid 82. The alignment grid 82, having upper surface 34 defining portions of chamber 32, is preferably constructed of a sheet of Kapton® substrate or other similar material. The alignment grid 82 includes a lower surface 83 and a plurality of windows 84 formed therethrough. The contact set substrate 81 includes a printed circuit having a top surface 90 and a bottom surface 91. The lower surface 83 of the alignment grid 82 is preferably laminated to the top surface 90 of the printed circuit to form the contact set substrate 81. Windows 84 thus form small wells to allow exposure of portions of top surface 90 of the contact set substrate 81, the exposed portions defining a contact surface of base 21.

Present in combination with the exposed portions of the top surface 90 of the contact set substrate 81 exist footprints 92 which preferably match the footprints of the lead configuration of the device under test, shown specifically herein as being a gull-wing lead configuration. It will be readily appreciated, that the lead portions 27 are shown as being comprised of a plurality of individual elements or leads 27A. Although not herein specifically shown, the bottom surface of the contact set substrate 81 preferably include footprints which desirably mate footprints of an external component such as a load board or other component. The footprints 92 present on the top surface 90 of the contact set substrate 81 exposed in the wells, and the footprints on the bottom surface of the contact set substrate 81, are desirably coated with a Particle Interconnect® contact medium 85 for facilitating the superior and necessary mechanical and electrical connection between the apparatus 20 and an external component, and the mechanical and electrical connection between the apparatus 20 and the leads of the device being tested.

Also shown in FIG. 5 is aperture 80A formed through contact assembly 80, and sized for selectively receiving one of the guide pins 40 of the base. Guide pins 40 serve to precisely align contact assembly 80 actuator 23 and device 26. Lower ends 40B of the guide pins are also receivable within apertures (not shown) which may be present on a load board for aligning apparatus 20 with the load board, correct alignment being important for testing device 26.

Regarding FIG. 6, lead 27A shown is a typical gull-wing lead, lead 27A extending outwardly from device 26 and terminating with a free end 100. Lead 27A also includes a contact surface 101 and a non-contact surface 102. Contact surface 101 defines the bottom of lead 27A, while the non-contact surface 102 defines the top of lead 27A opposing contact surface 101. When actuator 23 is placed upon and forced against device 26 when, for example, the lid 22 is manipulated into the closed position as previously described, free end 67 of compliant member 28 engages non-contact surface 102 depressing contact surface 101 of the lead 27A against the contact surface of base 21, i.e., the contact substrate surface exposed in the wells or windows 84. In this manner, contact surface 101 of the lead 27A is receivable thereagainst footprint 92 with the Particle Interconnect® contact medium 85 being present thereon. As a result, the Particle Interconnect® contact medium 85 contacts with the contact surface 101. The previous discussion applies to all leads 27A.

It is important for the proper function of apparatus 20, and to ensure accurate testing of devices, that sufficient pressure be applied across leads 27A to facilitate the necessary mechanical and electrical connection between the contact surfaces of the contact set substrate 81 and both the contact surfaces of the leads 27A and the external component which could be a load board or other component. It is highly desirable that approximately 10 grams of force be applied from compliant members 28 across each individual lead 27A of the device 26 to be tested in order to effectuate good mechanical and electrical contact between the contact surfaces 101 of the leads 27A and the contact substrate surfaces. Normally, each individual lead 27A possesses mechanical variances. That is, the individual leads 27A normally have varying thickness, widths, and lengths, and other mechanical variances. Also, the contact substrate surfaces have varying contours and mechanical variances. As a result of the mechanical variances present in the leads 27A, and the mechanical variances present on the contact substrate surfaces, compliance is desirable to accommodate all of these mechanical variances.

To this end, and with attention directed back to FIG. 5, each compliant member 28 includes a height H defined by the distance between lower surface 25 of body 60 of actuator 23 and free end 67, and a width W defined by free end 67. The ratio of height H to width W is herein defined as an aspect ratio, each compliant member 28 thus having an aspect ratio. To allow compliant members 28 to compensate for physical variations of the leads 27A, provide compliance between apparatus 20 and the leads 27A and substantial coplanarity between the contact surfaces 101 of the leads 27A and the contact surfaces of base 21 while allowing a sufficient focusing of force against the non-contact surfaces 102 of the leads 27A at the free end 67 to provide exemplary contact between the contact surfaces 101 of the leads 27A and the contact surfaces of the base 21 without damaging the leads in any way, it is important for the aspect ratio of each compliant member 28 to be at least 1:1 and not greater than 6:1 in a preferred embodiment. The aspect ratio of 6:1 may be increased, potentially, depending upon the type of material used to construct the compliant members 28.

If the aspect ratio falls below 1:1, the compliant members 28 become less and less compliant and function more as non-compliant members requiring the application of more downward force against body 60 of actuator 23 to achieve coplanarity as previously discussed and for compensating for the physical variations of the leads 27A at each free end 67 of each compliant member 28. However, application of more downward force such as >10 grams of force at each lead 27A can occasion damage to the leads 27A. Furthermore, if the aspect ratio exceeds, in a preferred embodiment, 6:1, the amount of force needed to provide contact, coplanarity and compliance at the free end 67 of each free standing compliant member 28 becomes increasingly high which can cause the compliant members 28 to buckle or fold.

In operation, when the free ends 67 of the compliant members 28 engage the non-contact surfaces 102 of the leads 27A, the elastomeric quality of the elastomer material accommodates all of the mechanical variances thereby facilitating superior contacting. In other words, when the compliant members 28, each having an aspect ratio of at least 1:1, are forced upon the leads, the compliance or give inherent with the elastomer material accommodates all of the mechanical variances and facilitates the exertion of substantially equal force across each individual lead 27A, desirably being approximately 10 grams of force. This is the introduction of compliance directed against the non-contact surfaces 102 of the leads 27A from the actuator 23. Additionally, because some of the leads 27A extending from the device can be angled in varying directions, the compliant members 28 absorb such variances providing each contact surface 101 of each lead 27A to be substantially flat with the contact substrate surface, thereby allowing the maximum amount of surface to surface contact. This is what is known as coplanarity, where substantially all of the surface of the contact surface 101 of each lead 27A is contacting the contact substrate surface. This provides for superior electrical contacting, and maximizes the result of the testing of the device being tested, without the mechanical variances in the apparatus and the mechanical variances inherent in the device to be tested to distort or inhibit the results of the testing.

Accordingly, compliant members 28 provide compliance between the base 21 of the apparatus 20 and the device 26, and for providing substantial coplanarity between the contact surface 101 of the device 26 leads 27A, and the contact surface of the contact set substrate 81. It is important that the thickness of the alignment grid 82 be less than the thickness of the leads 27A of device 26 when resting upon the contact surface of the contact set substrate, so that, even though the lead is sitting firmly in the well, the non-contact surface is exposed so that actuator 23 may apply the necessary pressure.

Regarding FIG. 7, shown is a compliant member 103 disposed between the bottom surface 31 of the base 21, the upper surface 34 of the alignment grid 82. The compliant member 103, which may be constructed of silicone rubber or other like and suitably compliant material, serves to accommodate the slight variations present upon the bottom surface 31 of the base 21, and the slight variations present upon the upper surface 34 of the alignment grid 82, thus facilitating good mechanical contact between the contact assembly 80 and the base 21.

Figure 9:
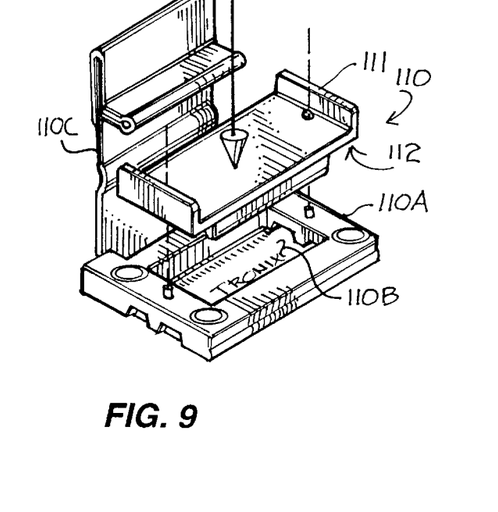
FIG. 9 illustrates a perspective view of an apparatus for testing a device in accordance with an alternate embodiment of the present invention.
Figure 10:
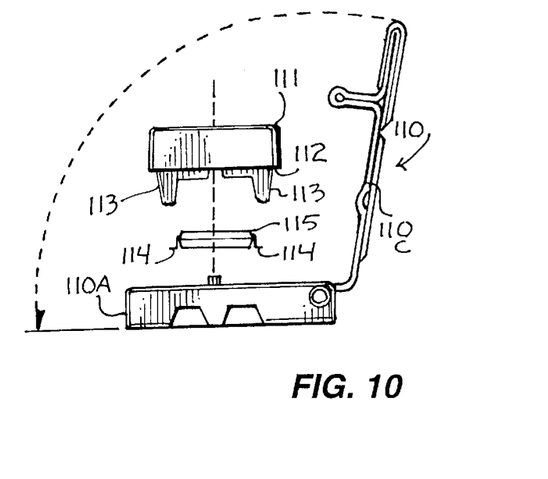
FIG. 10 illustrates a side elevational view of the apparatus of FIG. 9.

With reference now to FIG. 9 and FIG. 10, shown is an alternate embodiment of the instant invention. Shown is an apparatus generally designated by the reference character 110. Like apparatus shown in FIG. 1, apparatus 110 includes a base 110A having a chamber 110B, and hingedly attached to base 110A is seen a lid 110C. Also included is an actuator 111 having a lower surface 112, and shown having two compliant members 113, preferably constructed of an elastomer material such as silicone rubber, and having upper surfaces (not herein specifically shown) which have been adhesively affixed to the lower surface 112 of the actuator 111. The actuator 111 shown includes just two compliant members 113 for engagement with the pair of lead portions 114 seen in combination with a device 115.

Figure 11:
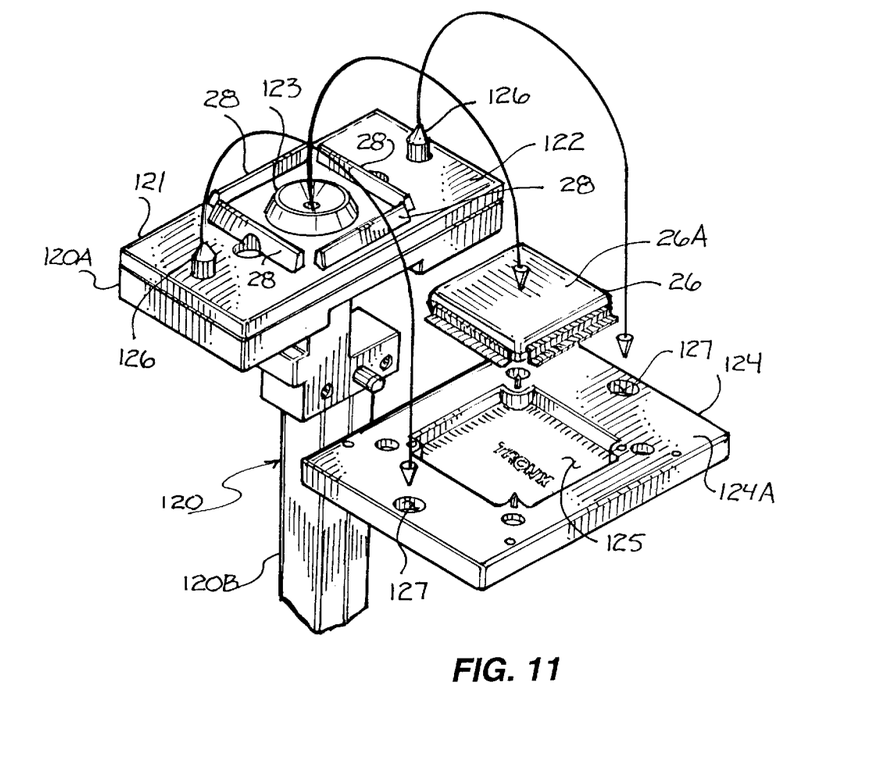
FIG. 11 illustrates a perspective view of an apparatus for testing a device in accordance with another alternate embodiment of the present invention.

Although the above referenced figures illustrate an apparatus used specifically for hand test applications, the alternate embodiment shown in FIG. 11 illustrates how the lid 22 may be replaced with an automated handler 120 for use with automated testing, the automated handler 120 including a plunger 120B. The automated handler 120 is shown having a actuator 121 secured to a face member 120A coupled to portions of plunger 120B. The actuator 121 includes plurality of compliant members 28 coupled to lower surface 122.

Also shown is a coupling member 123 for engaging the upper surface 26A of device 26. As can easily be seen, the device 26 is receivable within chamber 125 of base 124, with the actuator 121 forcibly disposed thereon by means of the automated handler 120, such that portions of the lower surface 122 of the actuator 121 bear against portions of upper surface 124A of base 124, while the compliant members 28 bear against the lead portions 27 of device 26. The actuator 121 is shown as having guide pins 126 receivable in apertures 127 formed through portions of base 124, for aligning the actuator 121 with the base 124.

The preferred embodiment of the instant invention as herein described and the alternate embodiments, lend themselves to versatility and adaptability. For instance, the amount of force applied across the various embodiments of the actuator may be selectively controlled dependent upon the needs of the user. For instance, the width of the body of the actuator may be selectively controlled and the aspect ratio of the compliant members may be selectively controlled, such that when the actuator is disposed against the device to be tested either using the lid portion or the automated handler in automated testing as the pressure means for exerting desired force upon the actuator, the desired amount of force may be applied across the leads of the device. Furthermore, configuration of the compliant member carried by the actuator in the embodiments disclosed herein is directly dependent upon the configuration of the leads of the device to be tested. Portions of the preferred and alternate embodiments of the apparatus as herein described including the base, the lid, and the body of the actuator, may be constructed of a suitable substantially rigid material such as stainless steel, or plastic such as a Torlon® material.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. An apparatus for testing a device including a plurality of elements each having a contact surface and a non-contact surface, the apparatus comprising:
   (a) a base for holding the device, the base having a contact surface engageable with the contact surface of each element;
   (b) a body;
   (c) a plurality of compliant members carried by and extending outwardly from the body and each terminating with a free end engagable with the non-contact surface of each element, each compliant member further including,
      (i) a height defined by the distance between the body and the free end,
      (ii) a width defined by the free end, and
      (iii) an aspect ratio defined by a ratio of the height relative the width, the aspect ratio being at least 1:1; and
   (d) means for exerting a force against the body;
   (e) the aspect ratio for allowing the compliant members to compensate for physical variations of the elements, provide compliance between the apparatus and the elements and substantial coplanarity between the contact surface of each element and the contact surface of the base while allowing a sufficient focusing of force against the non-contact surface of each element at the free end to provide contact between the contact surface of each element and the contact surface of the base without damaging the elements.

2. The apparatus of claim 1, wherein the contact surface of the base is non-compliant.

3. The apparatus of claim 1, wherein the means includes a lid mounted with the base for movement between a first position and a second position to engage and exert a force against the body.

4. The apparatus of claim 3, wherein the lid further includes an end hingedly coupled with the base.

5. The apparatus of claim 3, wherein the lid further includes a presentation element to engage the body in the second position of the lid for evenly presenting and exerting the free ends of the compliant members against the non-contact surface of each element in the second position of the lid.

6. The apparatus of claim 5, wherein the presentation element includes a protuberance carried by the lid to engage the actuator in the second position of the lid.

7. The apparatus of claim 3, wherein the lid further includes engagement means for detachably engaging the lid with the base in the second position of the lid.

8. The apparatus of claim 7, wherein the engagement means includes an engagement element carried by the lid and a detachably engagable complemental engagement element carried by the base.

9. The apparatus of claim 1, wherein the base further includes:
   a contact set substrate having a surface;
   an alignment grid mounted with the contact set substrate and having a plurality of windows formed therethrough exposing portions of the surface of the contact set substrate to define the contact surface of the base; and
   means for providing compliance between the contact set substrate and the base.

10. The apparatus of claim 1, wherein each compliant member is constructed of silicone.

11. A method of testing a device having a plurality of elements each including a contact surface and a non-contact surface, the method comprising the steps of:
   (a) providing a base for holding the device, the base having a contact surface;
   (b) engaging the contact surface of each element with the contact surface of the base;
   (c) providing compliant and substantial coplanar contact between the contact surface of the base and the contact surface of each element for inhibiting damage to the elements, further including the steps of:
      (i) providing a body having a plurality of compliant members extending outwardly therefrom each terminating with a free end engagable with the non-contact surface of each element, each compliant member further including,
         (1) a height defined by the distance between the body and the free end,
         (2) a width defined by the free end, and
         (3) an aspect ratio defined by a ratio of the height relative the width, the aspect ratio being at least 1:1; and
      (iii) exerting a force against the body, the aspect ratio of each compliant member to cause a sufficient focusing of force against the non-contact surface of each element at the free end while compensating for physical variations of the elements to provide compliance between the apparatus and the elements and substantial coplanarity between the contact surface of each element and the contact surface of the base.

12. The method of claim 11, wherein the step of exerting a force further includes the step of providing a lid mounted with the base for movement between a first position and a second position to engage and exert a force against the body.

13. The method of claim 12, wherein the step of providing a lid further includes the step of providing the lid with a protuberance to engage the body in the second position for evenly presenting and exerting the free ends of the compliant members against the non-contact surface of each element.

14. The method of claim 12, further including the step of detachably engaging the lid with the base in the second position of the lid.

15. The method of claim 14, wherein the step of detachably engaging the lid with the base in the second position of the lid further includes the steps of:

providing an engagement element carried by the lid; and providing a complemental engagement element carried by the base, the engagement element detachably engagable with the complemental engagement element in the second position of the lid.

16. The method of claim 11, wherein the step of exerting a force further includes the steps of:

mounting the body with an automated handler; and actuating the automated handler for pushing the body for exerting the free ends of the compliant members against the non-contact surface of each of the elements.

17. The method of claim 11, wherein the step of providing a base further includes the steps of:

providing a support member;

providing a contact assembly; and mounting the contact assembly with the support member.

18. The method of claim 17, wherein the step of providing a contact assembly further includes the steps of:

providing a contact set substrate having a surface;

providing an alignment grid having a plurality of windows formed therethrough; and mounting the alignment grid with the contact set substrate, the windows to expose portions of the surface of the contact set substrate to define the contact surface of the base.

19. The method of claim 18, wherein the step of mounting the contact assembly with the support member further includes the step of compliantly mounting the contact assembly with the support member.

20. The method of claim 19, wherein the step of compliantly mounting the contact assembly with the support member further includes the steps of:

providing a substantially compliant element;

mounting the contact assembly with the compliant element; and mounting the compliant element with the support member.

* * * * *